United States Patent
Yu et al.

(10) Patent No.: US 9,306,569 B2
(45) Date of Patent: Apr. 5, 2016

(54) COMPENSATION CIRCUIT FOR USE WITH INPUT BUFFER AND METHOD OF OPERATING THE SAME

(71) Applicant: SAMSUNG ELECTRONICS CO., LTD., Gyeonggi-do (KR)

(72) Inventors: Hye Seung Yu, Gyeonggi-do (KR); Jun Bae Kim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 7 days.

(21) Appl. No.: 14/326,501

(22) Filed: Jul. 9, 2014

(65) Prior Publication Data

US 2015/0016195 A1    Jan. 15, 2015

(30) Foreign Application Priority Data

Jul. 9, 2013 (KR) .................. 10-2013-0080469

(51) Int. Cl.
| | |
|---|---|
| *G11C 7/10* | (2006.01) |
| *H03K 19/003* | (2006.01) |
| *H03K 19/0175* | (2006.01) |
| *H03K 19/0185* | (2006.01) |
| *G11C 11/4093* | (2006.01) |

(52) U.S. Cl.
CPC ........ *H03K 19/00369* (2013.01); *G11C 7/1084* (2013.01); *H03K 19/017509* (2013.01); *H03K 19/018528* (2013.01); *G11C 11/4093* (2013.01)

(58) Field of Classification Search
CPC ....... G11C 7/10; G11C 7/1084; G11C 7/1039
USPC ............................ 365/189.05, 189.09, 230.08
See application file for complete search history.

(56) References Cited

U.S. PATENT DOCUMENTS

| | | | |
|---|---|---|---|
| 6,373,782 B1 | 4/2002 | Ikeda | |
| 6,429,710 B1 | 8/2002 | Ting et al. | |
| 7,187,196 B2 | 3/2007 | Han | |
| 7,358,793 B2 | 4/2008 | Sumita et al. | |
| 7,394,302 B2 * | 7/2008 | Shimazawa | H03K 5/133 327/261 |
| 7,454,303 B2 | 11/2008 | Magee et al. | |
| 7,495,483 B2 | 2/2009 | Kumar et al. | |
| 7,595,656 B2 | 9/2009 | Hayami et al. | |
| 7,768,320 B1 | 8/2010 | Yang et al. | |
| 7,965,105 B2 | 6/2011 | Dimitriu | |
| 8,054,663 B2 | 11/2011 | Chung | |
| 2003/0169081 A1 | 9/2003 | Han et al. | |
| 2007/0226671 A1 | 9/2007 | Hirata | |
| 2008/0218247 A1 | 9/2008 | Park et al. | |
| 2009/0066371 A1 * | 3/2009 | Kim | H03K 19/018578 327/108 |
| 2010/0073053 A1 * | 3/2010 | Shin | H03L 7/0814 327/158 |
| 2010/0182850 A1 | 7/2010 | Shiu et al. | |
| 2011/0148464 A1 * | 6/2011 | Hatakeyama | H03K 19/0027 326/63 |

FOREIGN PATENT DOCUMENTS

| | | |
|---|---|---|
| KR | 1020090059676 | 6/2009 |
| KR | 1020110003189 | 1/2011 |
| KR | 1020110112013 | 10/2011 |

* cited by examiner

*Primary Examiner* — Han Yang
(74) *Attorney, Agent, or Firm* — F. Chau & Associates, LLC

(57) ABSTRACT

A compensation circuit for use with an input buffer includes an input buffer configured to amplify an input signal and output a compensated signal. A process detector includes a replica of the input buffer. The process detector is configured to output at least one comparison signal indicating a variation in the input buffer. The input buffer controls an output signal based on the at least one comparison signal.

17 Claims, 14 Drawing Sheets

| Process Corner | C_OUT1 | C_OUT2 |
|---|---|---|
| FS | L | H |
| SF | H | L |

COMPENSATION CIRCUIT FOR USE WITH INPUT BUFFER AND METHOD OF OPERATING THE SAME

CROSS-REFERENCE TO RELATED APPLICATIONS

This application claims Korean Patent Application No. 10-2013-0080469, filed on Jul. 9, 2013, in the Korean Intellectual Property Office, the disclosure of which is incorporated by reference herein in its entirety.

TECHNICAL FIELD

One or more exemplary embodiments of the inventive concept relate to a process variation compensation circuit of an input buffer, and a method of operating the same.

DISCUSSION OF RELATED ART

An input buffer amplifies an input signal to provide a larger signal swing (e.g., a CMOS-level signal) and more noise margin for more reliable processing. A differential amplifier may be used as the input buffer.

The characteristics of the input buffer may vary according to a process variation thereof. When optimizing the input buffer to have duty characteristics of a predetermined range, more electric current may be consumed.

For example, when a signal input to the input buffer has a duty ratio of 50%, a duty ratio of a signal output from the input buffer varies according to a process variation in the input buffer. The variation in the duty ratio of the output signal may be increased further when a process corner of the input buffer is slow-fast (SF) or fast-slow (FS) than when the process corner of the input buffer is slow-slow (SS), typical-typical (TT), or fast-fast (FF).

SUMMARY

According to an exemplary embodiment of the inventive concept, a compensation circuit for use with an input buffer includes an input buffer and a process detector. The input buffer is configured to amplify an input signal and output a compensated signal. The process detector includes a replica of the input buffer. The process detector is configured to output comparison signals indicating a variation in the input buffer. The input buffer controls an output signal based on the comparison signals.

The input buffer may control a bias voltage of an output terminal according to the comparison signals.

The input buffer may include an input buffer differential amplifier configured to receive and differentially amplify a reference voltage and the input signal. The replica may include a replica buffer differential amplifier including two input terminals to which the reference voltage is applied. The replica buffer differential amplifier is configured to output a replica voltage.

The input buffer may further include an output adjust unit configured to decrease a bias voltage of an output terminal when the variation is slow-fast (SF) and to increase the bias voltage of the output terminal when the variation is fast-slow (FS).

The compensation circuit may further include a first comparator and a second comparator. The first comparator is configured to compare the replica voltage with a first reference voltage and output a first comparison signal according to a result of the comparison. The second comparator is configured to compare the replica voltage with a second reference voltage and output a second comparison signal according to a result of the comparison.

The compensation circuit may further include a first storage unit configured to store the first comparison signal and a second storage unit configured to store the second comparison signal.

The input buffer differential amplifier may further include a pull-down unit and a pull-up unit. The pull-down unit is connected with a first pull-down node having a bias voltage that is less than or equal to the bias voltage of the output terminal and a second pull-down node having a bias voltage that is less than the bias voltage of the first pull-down node. The pull-down unit is selectively switched according to the first comparison signal. The pull-up unit is connected with a first pull-up node having a bias voltage that is equal to or greater than the bias voltage of the output terminal and a second pull-up node having a bias voltage that is greater than the bias voltage of the first pull-up node. The pull-up unit is selectively switched according to the second comparison signal.

The first reference voltage and the second reference voltage may be set based on a preset condition of process corners of the input buffer.

Each of the input buffer differential amplifier and the replica buffer differential amplifier includes a Bazes type buffer, an N-P type buffer, or a combination of the Bazes type buffer and the N-P type buffer.

According to an exemplary embodiment of the inventive concept, a semiconductor device includes the process variation compensation circuit of an input buffer.

The semiconductor device may be a dynamic random access memory (DRAM) configured to receive an address signal, a command signal, and a data input signal. The input buffer may amplify the address signal, the command signal, or the data input signal.

According to an exemplary embodiment of the inventive concept, a method of compensating for a process variation in an input buffer of a semiconductor device includes detecting a variation in an input buffer by using a replica of the input buffer. An output of the input buffer is controlled based on the detected process variation.

Detecting the variation may include comparing an output of the replica with preset reference voltages and outputting logic levels according to a result of the comparison.

Detecting the variation may further include storing the logic levels in registers, respectively. The output of the input buffer may be controlled based on the logic levels stored in the registers.

The semiconductor device may be a dynamic random access memory (DRAM). Detecting the variation may be performed together with ZQ calibration of the DRAM.

According to an exemplary embodiment of the inventive concept, a circuit for compensating for a process variation comprises a first buffer. The first buffer is configured to receive an input signal and a reference signal through two input terminals, respectively, and output an output signal. A second buffer has substantially the same configuration as the first buffer. The second buffer is configured to receive the reference signal through two input terminals and output a replica voltage. A first comparator is configured to compare the replica voltage with a first reference voltage and output a first comparison signal. A second comparator is configured to compare the replica voltage with a second reference voltage and output a second comparison signal. The first buffer is configured to adjust the output signal depending on the first comparison signal and the second comparison signal.

The first buffer may comprise a differential amplifier.

The circuit may further comprise a first storage unit configured to store the first comparison signal and a second storage unit configured to store the second comparison signal.

The first reference voltage and the second reference voltage may be set based on a preset condition of process corners of the first buffer.

The differential amplifier may include a Bazes type buffer or an N-P type buffer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1:
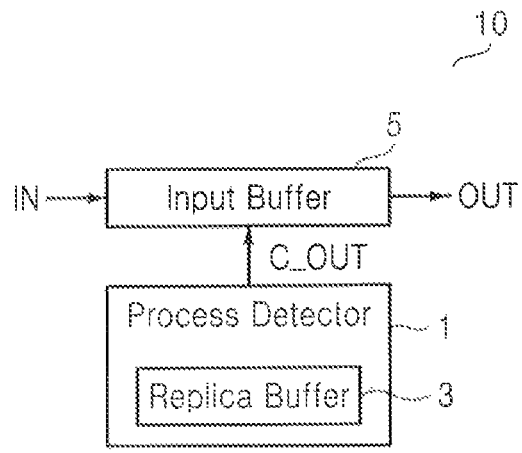
FIG. 1 is a block diagram of a process variation compensation circuit of an input buffer according to an exemplary embodiment of the inventive concept.

Hereinafter, exemplary embodiments of the inventive concept will be described in detail with reference to the accompanying drawings. The inventive concept, however, may be modified in various different ways, and should not be construed as limited to the embodiments set forth herein. The same reference numerals may be used to denote the same or substantially the same elements throughout the specification and the drawings. As used herein, the singular forms "a," "an," and "the" are intended to include the plural forms as well, unless the context clearly indicates otherwise. It will be understood that when an element or layer is referred to as being "on," "connected to," "coupled to," or "adjacent to" another element or layer, it can be directly on, connected, coupled, or adjacent to the other element or layer, or intervening elements or layers may be present.

FIG. 1 is a block diagram of a process variation compensation circuit 10 of an input buffer according to an exemplary embodiment of the inventive concept.

Referring to FIG. 1, the process variation compensation circuit 10 includes a process detector 1 and an input buffer 5.

The input buffer 5 is a circuit configured to amplify an input small signal IN and to output an output signal OUT. The input buffer 5 may include, for example, a differential amplifier (not shown).

The process detector 1 includes a replica buffer 3 having substantially the same structure as the input buffer 5. The process detector 1 detects a process variation in the input buffer 5 by using the replica buffer 3 and outputs a comparison signal C_OUT indicating the process variation in the input buffer 5 to the input buffer 5.

The input buffer 5 controls the output signal OUT based on the comparison signal C_OUT. For example, the input buffer 5 may receive the input small signal IN having a preset duty ratio, e.g., about 50%. The output signal OUT of the input buffer 5 has substantially the same duty ratio, e.g., about 50%, as the input small signal IN, but the duty ratio of the output signal OUT might not be about 50% due to the process variation in the input buffer 5. Thus, the input buffer 5 may control the duty ratio of the output signal OUT to be within a predetermined range of about 50%. However, exemplary embodiments of the inventive concept are not limited thereto.

In an exemplary embodiment of the inventive concept, the input buffer 5 may control the duty ratio of the output signal OUT by controlling a bias voltage of an output terminal thereof.

In an exemplary embodiment of the inventive concept, the input buffer 5 may control the duty ratio of the output signal OUT by adjusting a time taken for a logic level of the output signal OUT to shift, for example, from logic high to logic low or from logic low to logic high.

Figure 2:
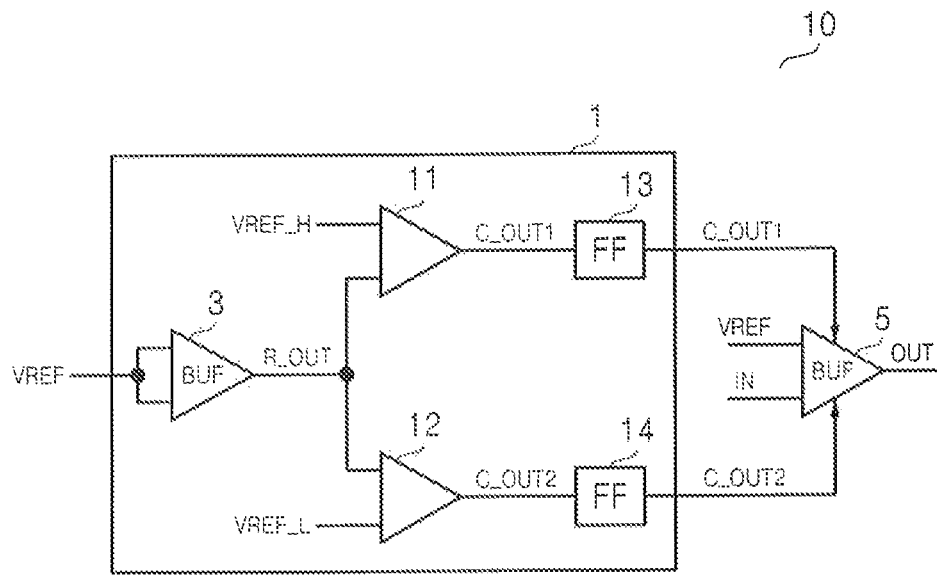
FIG. 2 is a detailed block diagram of a process variation compensation circuit of FIG. 1, according to an exemplary embodiment of the inventive concept.
Figures 3, 4:
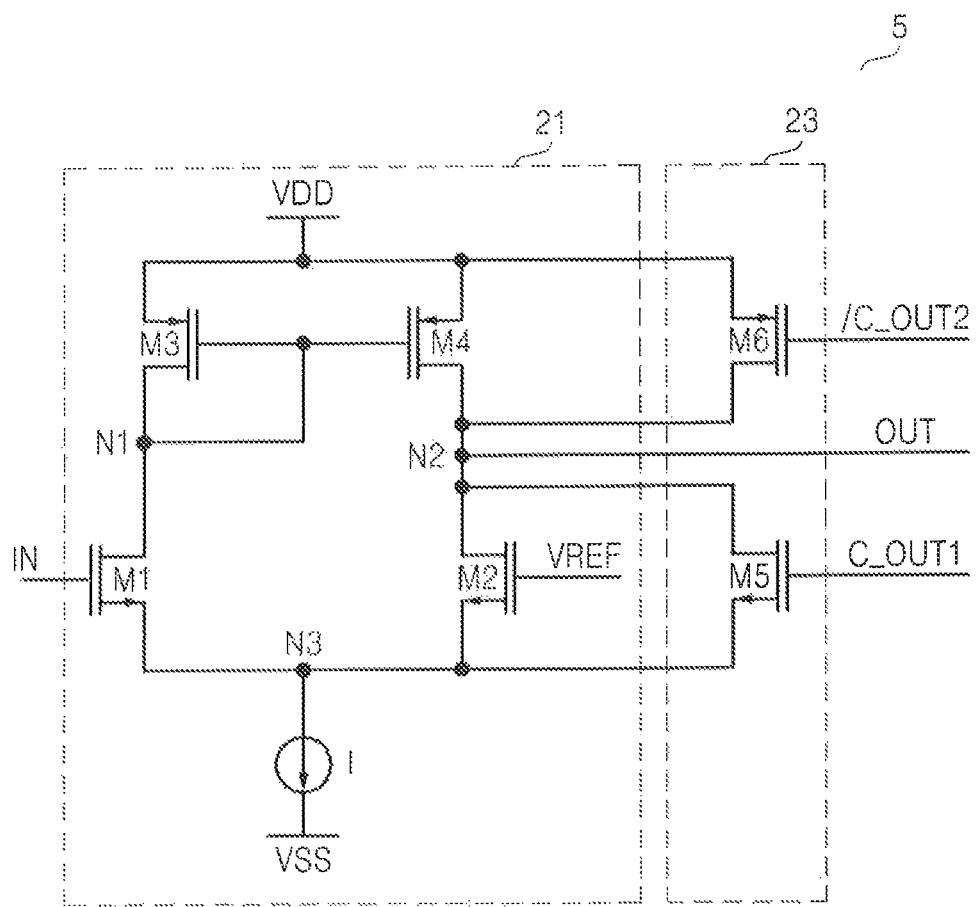
FIG. 3 is a table showing comparison signals according to process corners of an input buffer of FIG. 1, according to an exemplary embodiment of the inventive concept.
FIG. 4 is a detailed circuit diagram of an input buffer of FIG. 2, according to an exemplary embodiment of the inventive concept.
Figure 5:
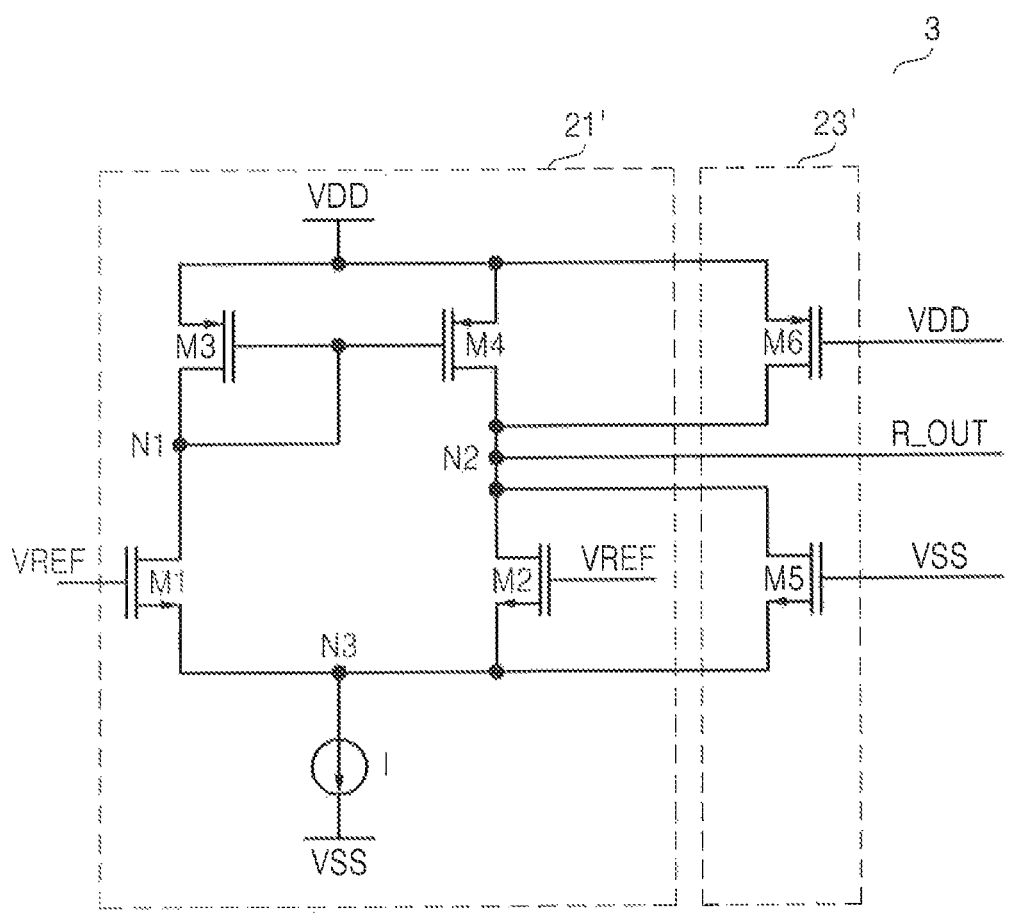
FIG. 5 is a detailed circuit diagram of a replica buffer of FIG. 2, according to an exemplary embodiment of the inventive concept.

FIG. 2 is a detailed block diagram of a process variation compensation circuit 10 of FIG. 1, according to an exemplary embodiment of the inventive concept. FIG. 3 is a table showing comparison signals according to process corners of an input buffer 5 of FIG. 1, according to an exemplary embodiment of the inventive concept. FIG. 4 is a detailed circuit diagram of an input buffer 5 of FIG. 2, according to an exemplary embodiment of the inventive concept. FIG. 5 is a detailed circuit diagram of a replica buffer 3 of FIG. 2, according to an exemplary embodiment of the inventive concept.

Referring to FIGS. 2 to 5, the input buffer 5 may include an input buffer differential amplifier 21 and an input buffer output adjust unit 23.

The input buffer differential amplifier 21 may receive and differentially amplify an input small signal IN and a reference voltage VREF. For example, the input buffer differential amplifier 21 may amplify a difference between a voltage of the input small signal IN and the reference voltage VREF and may output an output signal OUT.

The input buffer output adjust unit 23 may receive a first comparison signal C_OUT1 and a second comparison signal C_OUT2 from the process detector 1 and may control the output signal OUT based on the first comparison signal C_OUT1 and the second comparison signal C_OUT2.

For example, the input buffer output adjust unit 23 may control a duty ratio of the output signal OUT by adjusting a bias voltage of the output terminal N2.

For the purpose of description, the structures of the differential amplifier 21 and the input buffer output adjust unit 23 included in the input buffer 5 will be described in detail below.

The process detector 1 may include a replica buffer 3, a first comparator 11, a second comparator 12, a first storage unit 13, and a second storage unit 14.

The replica buffer 3 has substantially the same structure as the input buffer 5. For example, the replica buffer 3 may include a replica buffer differential amplifier 21' having substantially the same structure as the input buffer differential amplifier 21 and a replica buffer output adjust unit 23' having substantially the same structure as the input buffer output adjust unit 23.

The same voltage, e.g., the reference voltage VREF, may be applied to two input terminals of the replica buffer differential amplifier 21'. In this case, the replica buffer differential amplifier 21' outputs a predetermined bias voltage R_OUT. Hereinafter, the bias voltage R_OUT may be referred to as a replica voltage R_OUT.

The first comparator 11 compares the replica voltage R_OUT with a first reference voltage VREF_H, and outputs a first comparison signal C_OUT1 based on a result of the comparison.

The second comparator 12 compares the replica voltage R_OUT with a second reference voltage VREF_L and outputs a second comparison signal C_OUT2 based on a result of the comparison.

In an exemplary embodiment of the inventive concept, the first comparator 11 may output a first logic level (e.g., a logic high level) when the replica voltage R_OUT is equal to or greater than the first reference voltage VREF_H, and output a second logic level (e.g., a logic low level) that is different from the first logic level when the replica voltage R_OUT is less than the first reference voltage VREF_H.

The second comparator 12 may output the first logic level when the replica voltage R_OUT is less than or equal to the second reference voltage VREF_L, and output the second logic level when the replica voltage R_OUT is greater than the first reference voltage VREF_H.

However, exemplary embodiments of the inventive concept are not limited thereto, and the respective comparison operations of the first and second comparators 11 and 12 may be performed in different ways.

The first reference voltage VREF_H and the second reference voltage VREF_L may be set according to a condition of process corners of the input buffer 5.

The process corners may be classified into fast-fast (FF), slow-slow (SS), fast-slow (FS), slow-fast (SF), and typical-typical (TT) according to carrier mobilities of an n-channel metal-oxide-semiconductor (NMOS) field-effect transistor (FET) and a p-channel metal-oxide-semiconductor (PMOS) field-effect transistor (FET).

In an exemplary embodiment of the inventive concept, according to the condition of the process corners, a case where the carrier mobilities of the NMOS or PMOS field-effect transistors are higher by a predetermined ratio than those of the NMOS or PMOS field-effect transistors when a process corner of the input buffer 5 is 'TT' may be set as 'F', and a case where the carrier mobilities of the NMOS or PMOS FETs are lower by the predetermined ratio than carrier mobilities of the NMOS or PMOS FETs when the process corner of the input buffer 5 is 'TT' may be set as 'S'. The predetermined ratio may have a preset value.

When the predetermined ratio is, for example, 10%, the first reference voltage VREF_H may be set as the replica voltage R_OUT output from the replica buffer 3 when the carrier mobility of the NMOS FET is lower by 10% than that of the NMOS FET when the process corner of the input buffer 5 is 'TT' and the carrier mobility of the PMOS FET is higher by 10% than that of the PMOS FET when the process corner of the input buffer 5 is 'TT'.

The second reference voltage VREF_L may be set as the replica voltage R_OUT output from the replica buffer 3 when the carrier mobility of the NMOS FET is higher by 10% than that of the NMOS FET when the process corner of the input buffer 5 is 'TT' and the carrier mobility of the PMOS FET is lower by 10% than that of the PMOS FET when the process corner of the input buffer 5 is 'TT'.

The input buffer 5 and the replica buffer 3 may be manufactured on the same wafer and may have the same process corners.

The replica voltage R_OUT when the process corners of the input buffer 5 and the replica buffer 3 are 'FS' is lower than when the process corners of the input buffer 5 and the replica buffer 3 are 'TT'. Thus, the replica voltage R_OUT is less than or equal to the second reference voltage VREF_L. Accordingly, the first comparison signal C_OUT1 may be at a logic low level and the second comparison signal C_OUT2 may be at a logic high level.

The replica voltage R_OUT when the process corners of the input buffer 5 and the replica buffer 3 are 'SF' is higher than when the process corners of the input buffer 5 and the replica buffer 3 are 'TT', and the replica voltage R_OUT is thus equal to or greater than the first reference voltage VREF_H. Thus, the first comparison signal C_OUT may be at a logic high level, and the second comparison signal C_OUT2 may be at a logic low level.

The first storage unit 13 may store the first comparison signal C_OUT1 and output the first comparison signal C_OUT1 to the input buffer 5. The second storage unit 14 may store the second comparison signal C_OUT2 and output the second comparison signal C_OUT2 to the input buffer 5. In an exemplary embodiment of the inventive concept, the first storage unit 13 and the second storage unit 14 may be flip-flops.

When the input buffer 5 is used in a predetermined semiconductor device, the process detector 1 may generate the first comparison signal C_OUT1 and the second comparison signal C_OUT2 and may store the first comparison signal C_OUT1 and the second comparison signal C_OUT2 in the first storage unit 13 and the second storage unit 14, respectively, during initialization of the predetermined semiconductor device.

The process detector 1 may output the stored first comparison signal C_OUT1 and second comparison signal C_OUT2 to the input buffer 5, and the input buffer 5 may control the bias voltage of the output terminal N2 based on the first comparison signal C_OUT1 and the second comparison signal C_OUT2.

The input buffer differential amplifier 21 may include a first power supply line, a second power supply line, a current source I, a first transistor M1, a second transistor M2, a third transistor M3, and a fourth transistor M4.

A first reference voltage VDD is applied via the first power supply line, and a second reference voltage VSS is applied via the second power supply line.

The current source I is connected between the second power supply line and a third node N3.

The first transistor M1 is connected between a first node N1 and the third node N3, and an input small signal IN is supplied to a gate of the first transistor M1.

The second transistor M2 is connected between a second node N2 and the third node N3, and the reference voltage VREF is applied to a gate of the second transistor M2. The second node N2 may be substantially the same as the output terminal of the input buffer 5.

The third transistor M3 is connected between the first node N1 and the first power supply line, and a gate of the third transistor M3 is connected to the first node N1.

The fourth transistor M4 is connected between the second node N2 and the first power supply line, and a gate of the fourth transistor M4 is connected to the first node N1.

The input buffer differential amplifier 21 may amplify the difference between a voltage of the input small signal IN and the reference voltage VREF and may output the output signal OUT to the second node N2 or the output terminal.

However, the structure of the input buffer differential amplifier 21 is not limited thereto, and the input buffer differential amplifier 21 may be embodied in various different forms.

In an exemplary embodiment of the inventive concept, the input buffer differential amplifier 21 may be a Bazes type buffer, an N-P type buffer, or a combination of the Bazes type buffer and the N-P type buffer.

The input buffer output adjust unit 23 may reduce the bias voltage of the output terminal N2 when the process corner of the input buffer 5 is 'SF' and may increase the bias voltage of the output terminal N2 when the process corner of the input buffer 5 is 'FS'. The bias voltage of the output terminal N2 means a voltage output from the output terminal N2 when a voltage of the input small signal IN is the same as the reference voltage VREF.

The input buffer output adjust unit 23 may include a pull-down unit M5 and a pull-up unit M6.

The pull-down unit M5 may be a circuit configured to reduce the bias voltage of the output terminal N2 according to the first comparison signal C_OUT1.

The pull-down unit M5 may be connected in parallel with the second transistor M2 between a first pull-down node and a second pull-down node and may selectively switch on/off according to the first comparison signal C_OUT1.

The first pull-down node means a node having a bias voltage that is less than or equal to the bias voltage of the output terminal N2 in the input buffer differential amplifier 21. The second pull-down node means a node having a bias voltage that is less than the bias voltage of the first pull-down node in the input buffer differential amplifier 21. The bias voltage means a voltage output to a target node when the voltage of the input small signal IN is equal to the reference voltage VREF.

For example, the first pull-down node may be the second node N2 and the second pull-down node may be the third node N3. In an exemplary embodiment of the inventive concept, the pull-down unit M5 may be an NMOS transistor and be activated when the first comparison signal C_OUT1 has the first logic level.

However, exemplary embodiments of the inventive concept are not limited thereto, and the structure and connection of the pull-down unit M5 may be embodied in other various ways.

In an exemplary embodiment of the inventive concept, the pull-down unit M5 may be embodied as a plurality of NMOS transistors connected in series or in parallel with each other.

In an exemplary embodiment of the inventive concept, the second pull-down node may be set as the second power supply line or the gate of the second transistor M2. When a cascode transistor (not shown) is additionally provided between the first node N1 and the first transistor M1 and between the second node N2 and the second transistor M2, the first pull-down node may be set as the second node N2 or a drain of the second transistor M2.

The pull-up unit M6 may be a circuit configured to increase the bias voltage of the output terminal N2 according to the second comparison signal C_OUT2.

The pull-up unit M6 may be connected in parallel with the fourth transistor M4 between the first pull-up node and the second pull-up node, and the pull-up unit M6 may be selectively switched according to the second comparison signal C_OUT2.

In the input buffer differential amplifier 21, the first pull-up node has a bias voltage that is equal to or greater than the bias voltage of the output terminal N2 and the second pull-up node has a bias voltage that is greater than the bias voltage of the first pull-up node.

For example, the first pull-up node may be the second node N2 and the second pull-up node may be the first power supply line. In an exemplary embodiment of the inventive concept, the pull-up unit M6 may be a PMOS transistor and may be activated when a result of inverting the second comparison signal C_OUT2 is in the second logic level, e.g., when the second comparison signal C_OUT2 is in the first logic level.

However, exemplary embodiments of the inventive concept are not limited thereto, and the structure and connection of the pull-up unit M6 may be embodied in various different forms.

The structure of the replica buffer 3 is substantially the same as the input buffer 5.

In the replica buffer differential amplifier 21', the same reference voltage VREF is applied to a gate of a first transistor M1 and a gate of the second transistor M2.

The replica buffer 3 may include the replica buffer output adjust unit 23' to reflect an effect caused by a parasitic capacitance of the input buffer output adjust unit 23.

The replica buffer output adjust unit 23' is deactivated. For example, the pull-up unit M6 and the pull-down unit M5 may be deactivated when the first reference voltage VDD is applied to a gate of the PMOS transistor of the pull-up unit M6 and the second reference voltage VSS is applied to a gate of the NMOS transistor of the pull-down unit M5.

The process detector 1 compares the replica voltage R_OUT with the reference voltages VREF_H and VREF_L by using the two comparators 11 and 12, generating two comparison signals C_OUT1 and C_OUT2. The input buffer 5 controls the output signal OUT of the input buffer 5 according to the two comparison signals C_OUT1 and C_OUT2.

However, exemplary embodiments of the inventive concept are not limited thereto. The process detector 1 may include k comparators. The k comparators may generate k comparison signals, respectively, and the input buffer 5 may control the output signal OUT of the input buffer 5 according to the k comparison signals. Here, 'k' denotes an arbitrary natural number.

Figure 6:
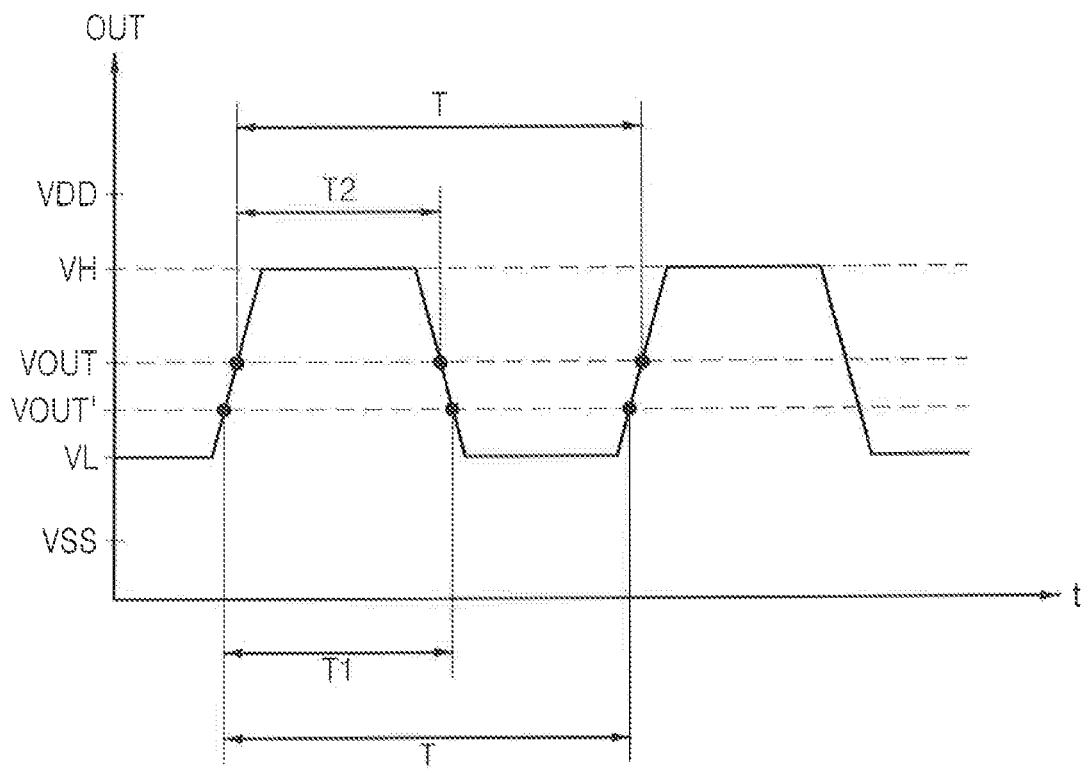
FIG. 6 is a timing diagram of an output signal of an input buffer of FIG. 4, according to an exemplary embodiment of the inventive concept.

FIG. 6 is a timing diagram of the output signal OUT of an input buffer 5 of FIG. 4, according to an exemplary embodiment of the inventive concept.

Referring to FIGS. 2 to 6, for purposes of description, the input buffer 5 receives an input small signal IN having a cycle of T and a duty ratio of 50% and a process corner of the input buffer 5 is 'FS'. Since the process corner is 'FS', the first comparison signal C_OUT may be at a logic low level and the second comparison signal C_OUT2 may be at a logic high level.

For purposes of description, when the bias voltage VOUT is pulled up, a variation in a slew rate in a section in which the output signal OUT changes from logic low to logic high is negligibly small.

The output signal OUT may have a cycle of T and may swing between a first swing voltage VH that is less than or equal to the first reference voltage VDD and a second swing voltage VL that is equal to or greater than the second reference voltage VSS.

When the input buffer 5 does not include the input buffer output adjust unit 23, the process corner is 'FS,' and thus, the NMOS field-effect transistor has a greater carrier mobility and the NMOS field-effect transistor has a smaller carrier mobility than when the process corner is 'TT'. Thus, a bias voltage VOUT' of the output signal OUT is decreased.

Thus, a cycle T1 increases and a duty ratio T1/T of the output signal OUT thus increases by greater than 50%. As the duty ratio T1/T increases, the input buffer 5 might not stably operate at an operating frequency.

When the input buffer 5 includes the input buffer output adjust unit 23, the first comparison signal C_OUT1 input to the gate of the pull-down unit M5 is at a logic low level and the pull-down unit M5 is thus deactivated.

Since an inverted second comparison signal/C_OUT2 input to the gate of the pull-up unit M6 is at a logic low level, the pull-up unit M6 is thus activated.

Thus, the pull-up unit M6 pulls up the bias voltage VOUT' of the output signal OUT and a duty ratio T2/T of the adjusted output signal OUT may be about 50%.

Similarly, the duty ratio of the output signal OUT may be improved when the process corner of the input buffer 5 is 'SF'.

Figure 7:
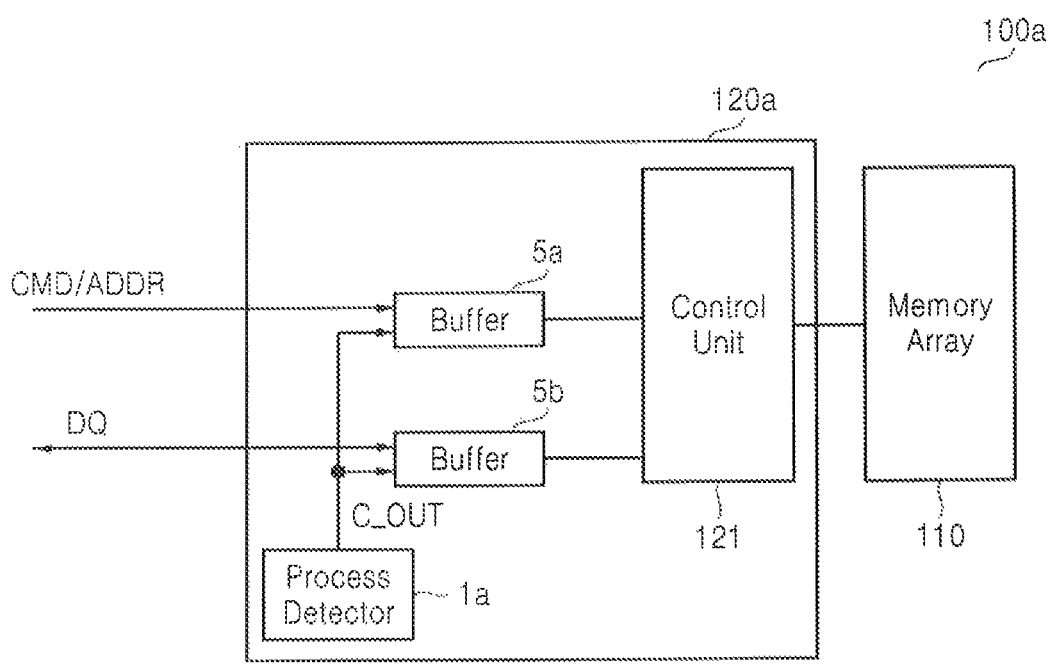
FIG. 7 is a block diagram of a memory device according to an exemplary embodiment of the inventive concept.

FIG. 7 is a block diagram of a memory device 100a according to an exemplary embodiment of the inventive concept.

Referring to FIG. 7, the memory device 100a includes a memory array circuit 110 and a peripheral circuit 120a.

The memory array circuit 110 includes a plurality of semiconductor devices and stores data using the plurality of semiconductor devices. The memory array circuit 110 may be embodied as a volatile memory device or a nonvolatile memory device.

The volatile memory device may be embodied as a dynamic random access memory (DRAM), a static random access memory (SRAM), a thyristor RAM (T-RAM), a zero capacitor RAM (Z-RAM), or a twin transistor RAM (TTRAM).

The nonvolatile memory device may be embodied as an electrically erasable programmable read-only memory (EEPROM), a flash memory, a magnetic RAM (MRAM), a spin-transfer torque (STT)-MRAM, a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate memory (nFGm), a holographic memory, a molecular electronics memory device, or an insulator resistance change memory.

The peripheral circuit 120a may include a control unit 121, a command/address input buffer unit 5a, a data input buffer unit 5b, and a process detector 1a.

The command/address input buffer unit 5a receives a command signal CMD and an address signal ADDR from the outside, amplifies these signals, and outputs a result of amplifying the signals to the control unit 121.

The data input buffer unit 5b receives a data input signal DQ from the outside, amplifies the data input signal DQ, and outputs a result of amplifying the signal to the control unit 121.

The command/address input buffer unit 5a may include a plurality of input buffers (not shown) corresponding to pins of the memory device 100a to which the command signal CMD and the address signal ADDR are input.

The data input buffer unit 5b may include a plurality of input buffers (not shown) corresponding to pins of the memory device 100a to which the data input signal DQ is input.

The input buffers included in the command/address input buffer unit 5a and the data input buffer unit 5b may have substantially the same structure. For example, the input buffers may have substantially the same structure as the input buffer 5 of FIG. 4.

The process detector 1a may include a replica buffer (not shown) having substantially the same structure as the input buffers. For example, the process detector 1a may have substantially the same structure as the process detector 1 of FIG. 2.

The process detector 1a may store a comparison signal C_OUT indicating a process variation in the input buffers during initialization of the memory device 100a, and the process detector 1a may output the comparison signal C_OUT.

The command/address input buffer unit 5a and the data input buffer unit 5b may control outputs of the input buffers according to the comparison signal C_OUT.

The control unit 121 may control an operation of the memory array circuit 110 according to the command signal CMD, the address signal ADDR, and the data input signal DQ amplified by the command/address input buffer unit 5a and the data input buffer unit 5b.

Figure 8:
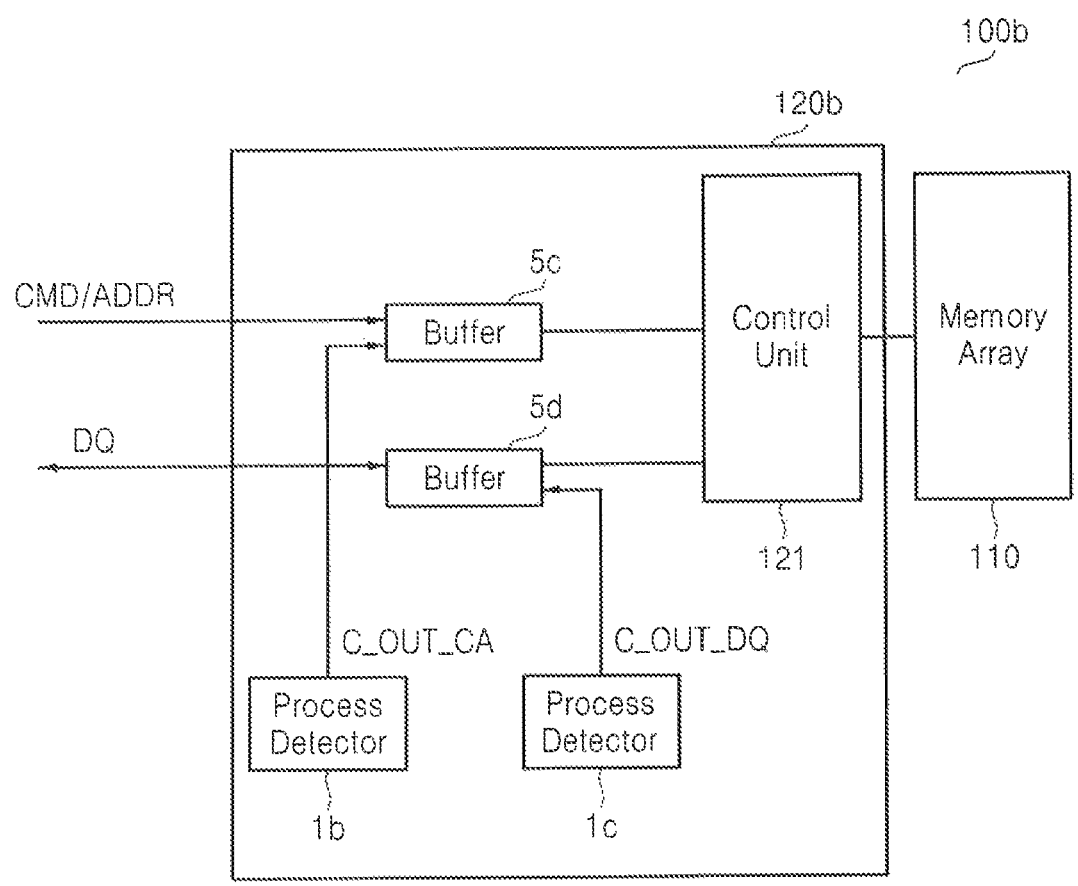
FIG. 8 is a block diagram of a memory device according to an exemplary embodiment of the inventive concept.

FIG. 8 is a block diagram of a memory device 100b according to an exemplary embodiment of the inventive concept. The structure of the memory device 100b of FIG. 8 is substantially the same as the memory device 100a of FIG. 7.

Referring to FIG. 8, the memory device 100b includes a memory array circuit 110 and a peripheral circuit 120b.

The peripheral circuit 120b may include a control unit 121, a command/address input buffer 5c, a data input buffer 5d, a command/address process detector 1b, and a data process detector 1c.

The command/address input buffer unit 5c may include a plurality of first input buffers (not shown) corresponding to pins of the memory device 100b to which a command signal CMD and an address signal ADDR are input.

The data input buffer unit 5d may include a plurality of second input buffers (not shown) corresponding to pins of the memory device 100b to which a data signal DQ is input.

The first input buffers may be different in structure from the second input buffers. For example, each of the first input buffers may include a Bazes type buffer and each of the second input buffers may include an N-P type buffer but exemplary embodiments of the inventive concept are not limited thereto.

The command/address process detector 1b may include a first replica buffer (not shown) having substantially the same structure as the first input buffers.

The command/address process detector 1b may store a CA comparison signal C_OUT_CA indicating a process variation in the first input buffers during initialization of the memory device 100b and may output the CA comparison signal C_OUT_CA.

The data process detector 1c may include a second replica buffer (not shown) having substantially the same structure as the second input buffers.

The data process detector 1c may store a DQ comparison signal C_OUT_DQ indicating a process variation in the second input buffers during initialization of the memory device 100b and may output the DQ comparison signal C_OUT_DQ.

The command/address input buffer unit 5c may control outputs of the first input buffers according to the CA comparison signal C_OUT_CA.

The data input buffer unit 5d may control outputs of the second input buffers according to the DQ comparison signal C_OUT_DQ.

Figure 9:
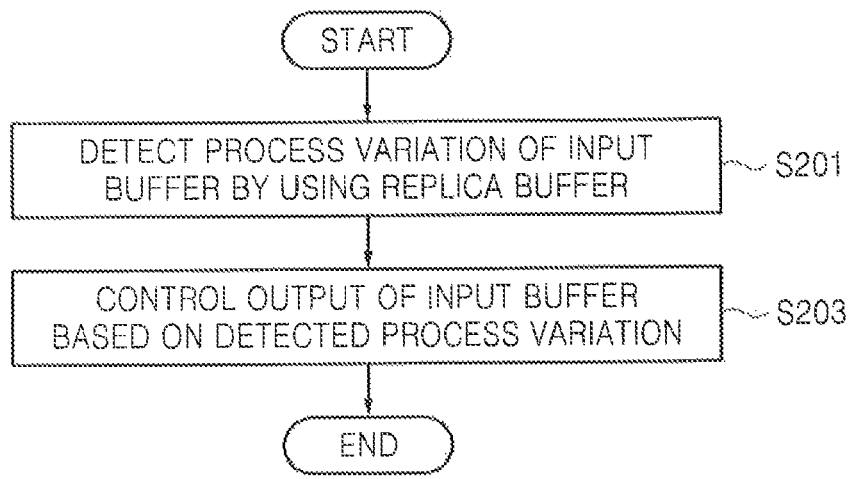
FIG. 9 is a flowchart of a method of compensating for a process variation in an input buffer according to an exemplary embodiment of the inventive concept.

FIG. 9 is a flowchart of a method of compensating for a process variation in an input buffer according to an exemplary embodiment of the inventive concept. The method of FIG. 9 may be performed by the process variation compensation circuit 10 of FIG. 1.

Referring to FIGS. 1 to 9, the process detector 1 detects a process variation in the input buffer 5 by using the replica buffer 3 having substantially the same structure as the input buffer 5 (operation S201).

The input buffer 5 controls an output based on the detected process variation (operation S203).

Figure 10:
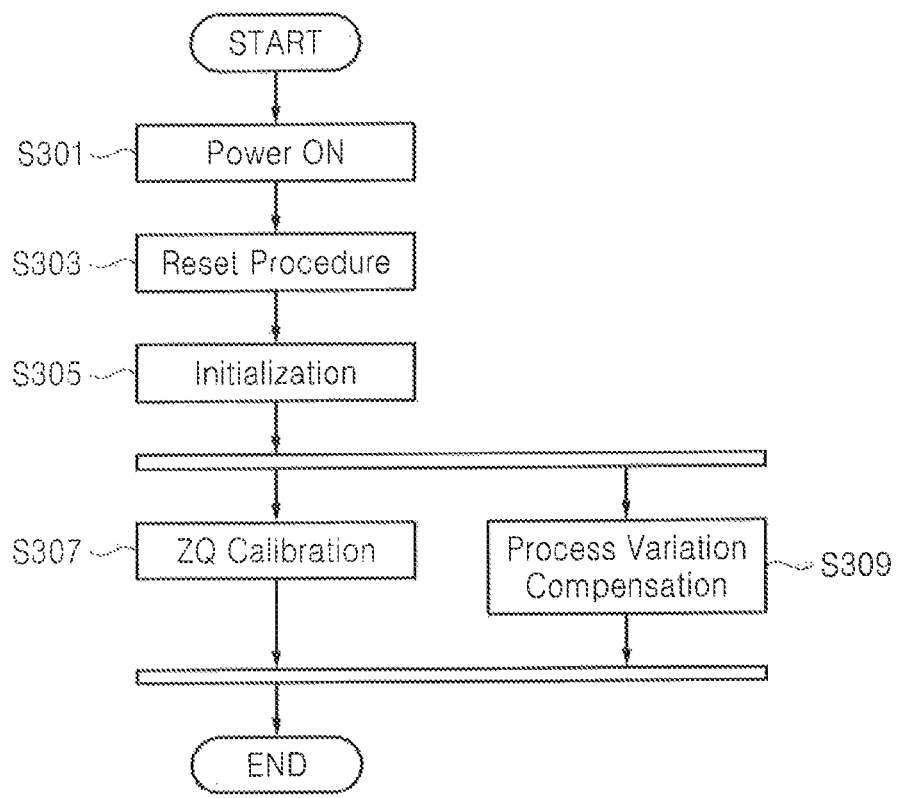
FIG. 10 is a flowchart of a process of initializing a dynamic random access memory (DRAM) according to an exemplary embodiment of the inventive concept.

FIG. 10 is a flowchart of a process of initializing a DRAM according to an exemplary embodiment of the inventive concept.

Referring to FIG. 10, the DRAM is powered on by supplying power thereto (operation S301).

When the DRAM is powered on, the DRAM may receive a reset signal from an outside device and perform a reset procedure of restarting the DRAM (operation S303).

The DRAM may perform an initialization process after performing the rest procedure (operation S305). The initialization process sets a basic code for performing, for example, a write/read operation of the DRAM, and the initialization process may include setting a mode register (MRS) included in the DRAM in a default mode, setting an ON/OFF state of a delay-locked loop (DLL), and setting a read latency.

The DRAM may perform ZQ calibration, preventing a signal distortion caused by a carrier wave during a high-speed operation (operation S307). The ZQ calibration may include impedance matching performed between a transmission side and a receiving side by using a ZQ pin of the DRAM.

Operations S301 to S307 may include the power-on, resetting, and initialization procedures defined in the Joint Electron Device Engineering Council (JEDEC) standards. Then, the DRAM may change the mode register (MRS) or perform, e.g., a read/write operation.

The process variation in the input buffer 5 may be compensated together with the ZQ calibration performed in operation S307 (operation S309). The compensation of the process variation (operation S309) may include operations S201 and S203 of FIG. 7.

As shown in FIG. 10, the compensation of the process variation (operation S309) is performed together with the ZQ calibration (operation S307) but exemplary embodiments of the inventive concept are not limited thereto. The compensation of the process variation (operation S309) may be performed at a different time from a time when the ZQ calibration (S307) is conducted.

In an exemplary embodiment of the inventive concept, the compensation of the process variation (operation S309) may be performed between the reset procedure (operation S303) and the initialization process (operation S305). Alternatively, the compensation of the process variation (operation S309) may be performed along with the initialization process (operation S305).

In an exemplary embodiment of the inventive concept, the compensation of the process variation (operation S309) may be performed between the initialization process (operation S305) and the ZQ calibration (operation S307). In an exemplary embodiment of the inventive concept, the compensation of the process variation (operation S309) may be performed after the ZQ calibration (operation S307) is completed.

Figure 11:
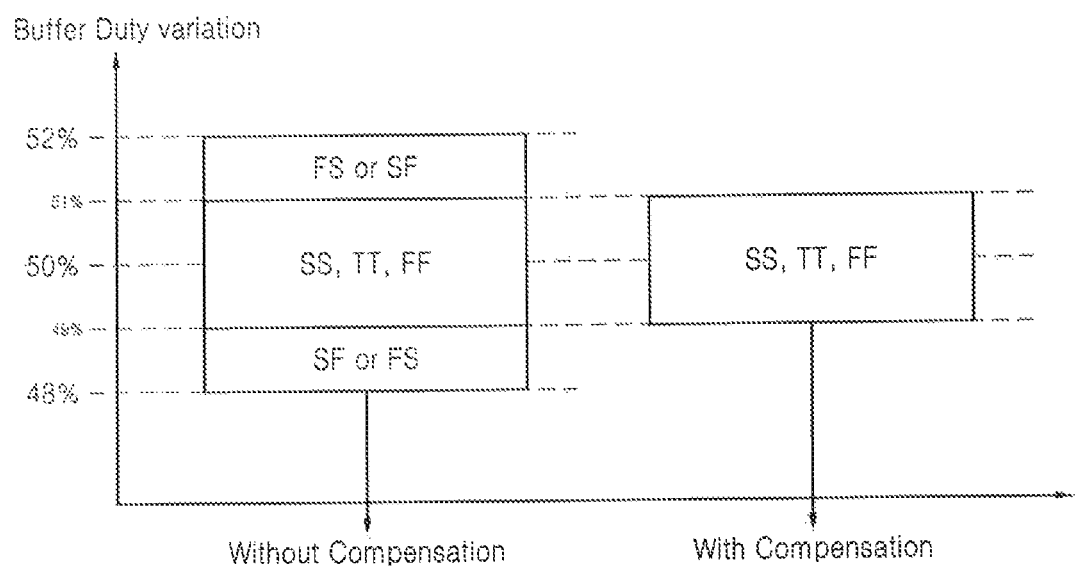
FIG. 11 is a graph showing variations in a duty ratio when compensating for a process variation and when not compensating for the process variation, according to an exemplary embodiment of the inventive concept.

FIG. 11 is a graph showing variations in a duty ratio when a process variation is compensated and not.

Referring to FIG. 11, for purposes of description, a duty ratio of an input small signal is 50% and a duty ratio of an output signal is 49% to 51% when the process corner is 'SS', 'TT', or 'FF'. For purposes of description, the duty ratio of the output signal is 48% to 52% when the process corner is 'SF' or 'FS'.

According to an exemplary embodiment of the inventive concept, the output signal is controlled when the process corner is 'SF' or 'FS,' and thus, the duty ratio of the output signal is within a range of 49% to 51% that is a range of the duty ratio of the output signal when the process corner is 'SS', 'TT', or 'FF'.

Accordingly, duty characteristics of the input buffer 5 may be improved, and the amount of additional current that is to be consumed during an optimization process of the input buffer 5 may be reduced.

A method of compensating for a process variation in a semiconductor device (e.g., an input buffer of a memory device) has been described above. Examples of the semiconductor device may include various devices each using an input buffer including an NMOS transistor and a PMOS transistor.

In an exemplary embodiment of the inventive concept, the semiconductor device may be a memory controller. Alternatively, the semiconductor device may be an application predetermined integrated circuit (ASIC).

Figure 12:
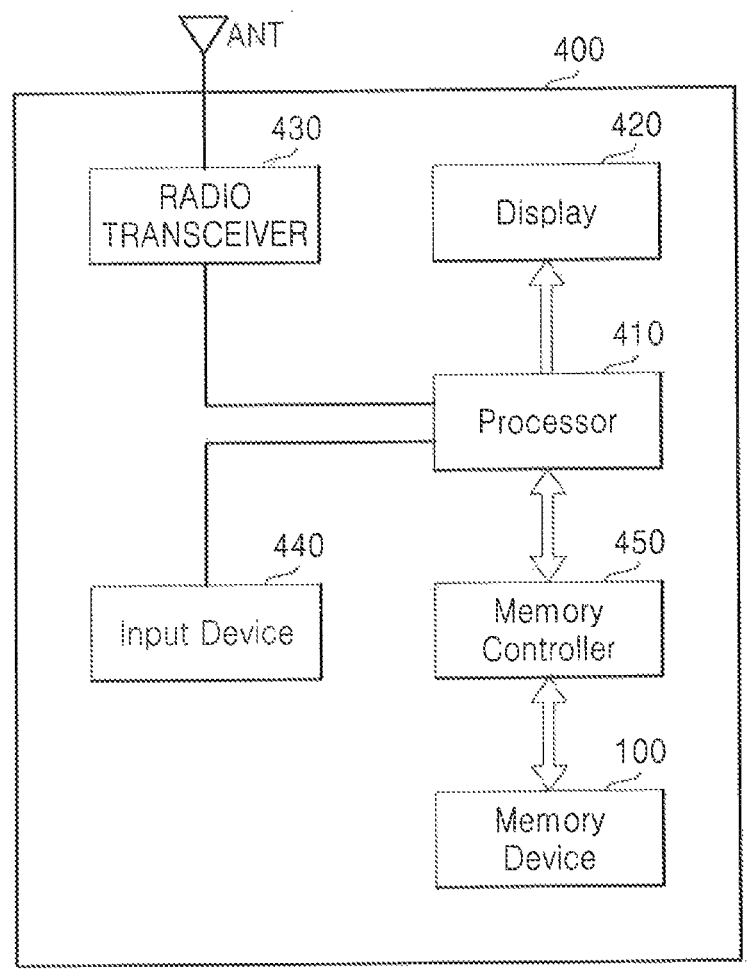
FIG. 12 is a block diagram of a memory system including a memory device illustrated in FIG. 7, according to an exemplary embodiment of the inventive concept.

FIG. 12 is a block diagram of a memory system 400 including a memory device illustrated in FIG. 7, according to an exemplary embodiment of the inventive concept. Referring to FIG. 12, the memory system 400 may be implemented in a cellular phone, a smart phone, a tablet personal computer (PC), a personal digital assistant (PDA) or a radio communication system.

The memory system 400 includes the memory device 100 and a memory controller 450 for controlling operation of the memory device 100. The memory device 100 may be the memory device illustrated in FIG. 7.

The memory controller 450 may control the data access operations of the memory device 100 according to the control of a processor 410.

The page data programmed in the memory device 100 may be displayed through a display 420 according to the control of the processor 410 and/or the memory controller 450.

A radio transceiver 430 transmits or receives radio signals through an antenna ANT. The radio transceiver 430 may convert radio signals received through the antenna ANT into signals that can be processed by the processor 410. Accordingly, the processor 410 may process the signals output from the radio transceiver 430 and transmit the processed signals to the memory controller 450 or the display 420. The memory controller 450 may program the signals processed by the processor 410 to the memory device 100.

The radio transceiver 430 may also convert signals output from the processor 410 into radio signals and output the radio signals to an external device through the antenna ANT.

An input device 440 enables control signals for controlling the operation of the processor 410 or data to be processed by the processor 410 to be input to the memory system 400. The input device 440 may include a pointing device such as a touch pad or a computer mouse, a keypad, or a keyboard.

The processor 410 may control the operation of the display 420 to display data output from the memory controller 450, data output from the radio transceiver 430, or data output from the input device 440. The memory controller 450, which controls the operations of the memory device 10, may be implemented as a part of the processor 410 or in a separate chip.

Figure 13:
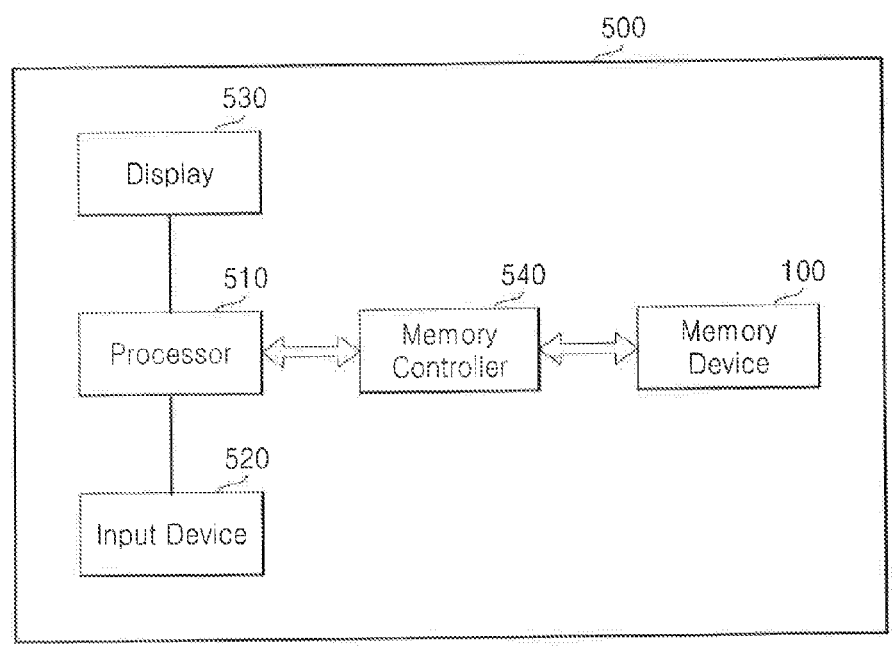
FIG. 13 is a block diagram of a memory system including a memory device illustrated in FIG. 7, according to an exemplary embodiment of the inventive concept.

FIG. 13 is a block diagram of a memory system 500 including a memory device illustrated in FIG. 7, according to an exemplary embodiment of the inventive concept. The memory system 500 may be implemented in a personal computer (PC), a tablet PC, a net-book, an e-reader, a personal digital assistant (PDA), a portable multimedia player (PMP), an MP3 player, or an MP4 player.

The memory system 500 includes the memory device 100 and a memory controller 540 for controlling operation of the memory device 100. The memory device 100 may be the memory device illustrated in FIG. 7.

A processor 510 may display data stored in the memory device 100 through a display 530 according to data input through an input device 520. The input device 520 may include a pointing device such as a touch pad or a computer mouse, a keypad, or a keyboard.

The processor 510 may control the overall operation of the memory system 500 and the operations of the memory controller 540. The memory controller 540, which may control the operations of the memory device 100, may be implemented as a part of the processor 510 or in a separate chip.

Figure 14:
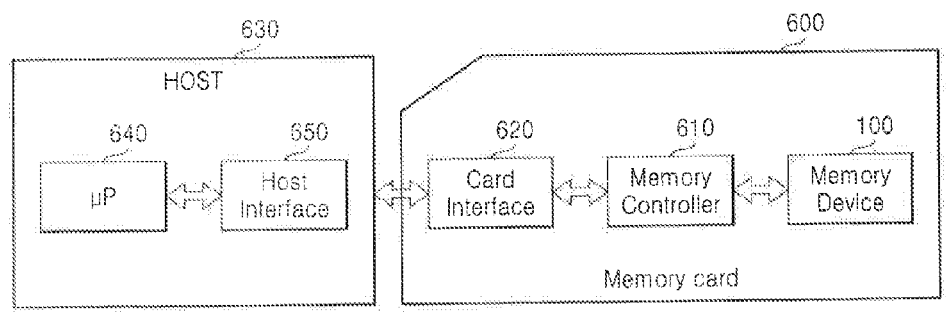
FIG. 14 is a block diagram of a memory system including a memory device illustrated in FIG. 7, according to an exemplary embodiment of the inventive concept.

FIG. 14 is a block diagram of a memory system 600 including a memory device illustrated in FIG. 7, according to an exemplary embodiment of the inventive concept. The memory system 600 may be implemented as a memory card or a smart card.

The memory system 600 includes the memory device 100, a memory controller 610 and a card interface 620. The memory device 100 may be the memory device illustrated in FIG. 7.

The memory controller 610 may control data exchange between the memory device 100 and the card interface 620. The card interface 620 may be a secure digital (SD) card interface or a multi-media card (MMC) interface, but exemplary embodiments of the inventive concept are not restricted thereto.

The card interface 620 may interface a host 630 and the memory controller 610 for data exchange according to a protocol of the host 630. The card interface 620 may support a universal serial bus (USB) protocol and an interchip (IC)-USB protocol. The card interface 620 may indicate a hardware interface supporting a protocol used by the host 630, a software interface installed in the hardware interface, or a signal transmission mode.

When the memory system 600 is connected with the host 630 such as a PC, a tablet PC, a digital camera, a digital audio player, a cellular phone, a console video game hardware, or a digital set-top box, a host interface 650 may perform data communication with the memory device 10 through the card interface 620 and the memory controller 610 according to the control of a microprocessor 640.

Figure 15:
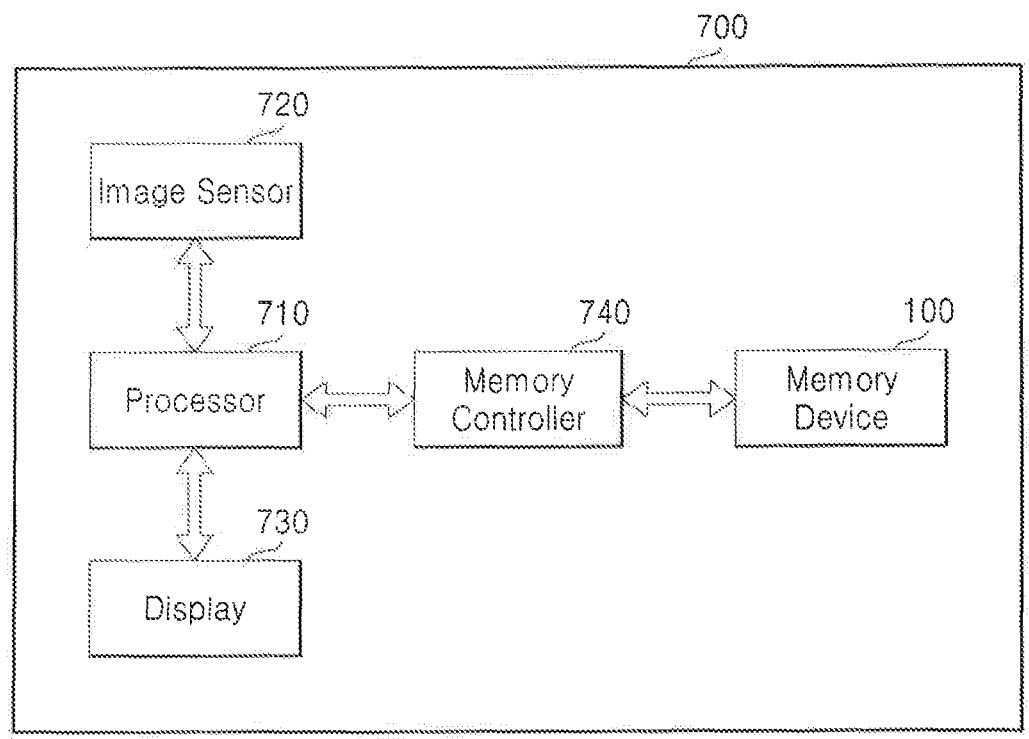
FIG. 15 is a block diagram of a memory system including a memory device illustrated in FIG. 7, according to an exemplary embodiment of the inventive concept.

FIG. 15 is a block diagram of a memory system 700 including a memory device illustrated in FIG. 7, according to an exemplary embodiment of the inventive concept. Referring to FIG. 15, the memory system 700 may be implemented in an image processor like a digital camera, a cellular phone equipped with a digital camera, a smart phone equipped with a digital camera, or a tablet PC equipped with a digital camera.

The memory system 700 includes the memory device 100 and a memory controller 740 controlling the data processing operations, such as a program operation, an erase operation, and a read operation, of the memory device 100. The memory device 100 may be the memory device illustrated in FIG. 7.

An image sensor 720 included in the memory system 700 converts optical images into digital signals and outputs the digital signals to a processor 710 or the memory controller 740. The digital signals may be controlled by the processor 710 to be displayed through a display 730 or stored in the memory device 10 through the memory controller 740.

Data stored in the memory device 100 may be displayed through the display 730 according to the control of the processor 710 or the memory controller 740. The memory controller 740, which may control the operations of the memory device 100, may be implemented as a part of the processor 710 or in a separate chip.

Figure 16:
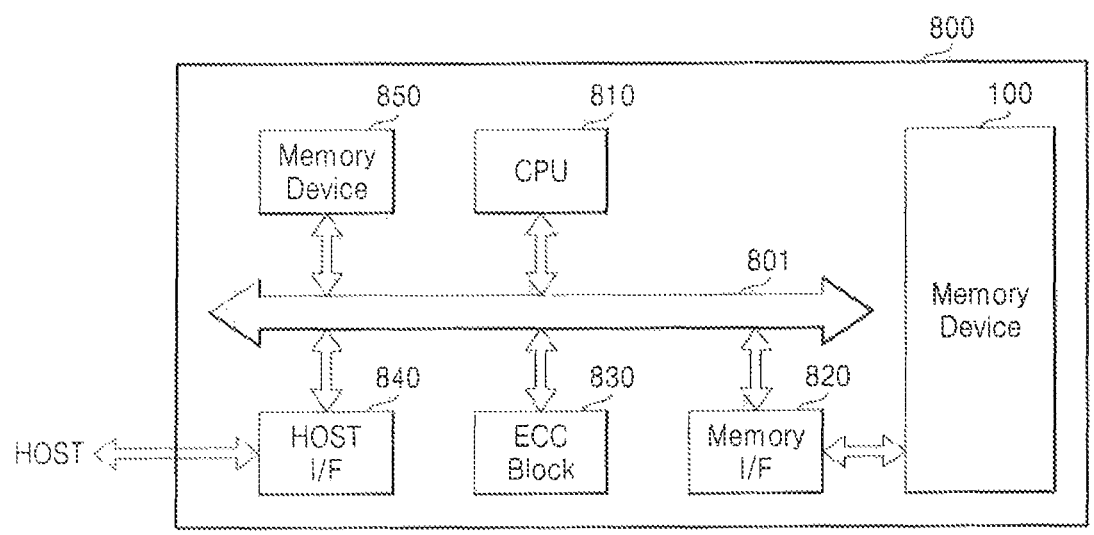
FIG. 16 is a block diagram of a memory system including a memory device illustrated in FIG. 7, according to an exemplary embodiment of the inventive concept.

FIG. 16 is a block diagram of a memory system 800 including a memory device illustrated in FIG. 7, according to an exemplary embodiment of the inventive concept. Referring to FIG. 16, the memory system 800 includes the memory device 100 and a central processing unit (CPU) 810 controlling operations of the memory device 100.

The memory system 800 may also include a memory device 850 that may be used as an operation memory of the CPU 810. The memory device 850 may be implemented by a non-volatile memory like read-only memory (ROM) or a volatile memory like static random access memory (SRAM).

At least one of the memory devices 100 and 850 may be the memory device illustrated in FIG. 7.

A host connected with the memory system 800 may perform data communication with the memory device 100 through a memory interface 820 and a host interface 840.

An error correction code (ECC) block 830 is controlled by the CPU 810 to detect an error bit included in data output from the memory device 100 through the memory interface 820, correct the error bit, and transmit the error-corrected data to the host through the host interface 840. The CPU 810 may control data communication between the memory interface 820, the ECC block 830, the host interface 840, and the operation memory device 850 through a bus 801.

The memory system 800 may be implemented in a flash memory drive, a USB memory drive, an IC-USB memory drive, or a memory stick.

Figure 17:
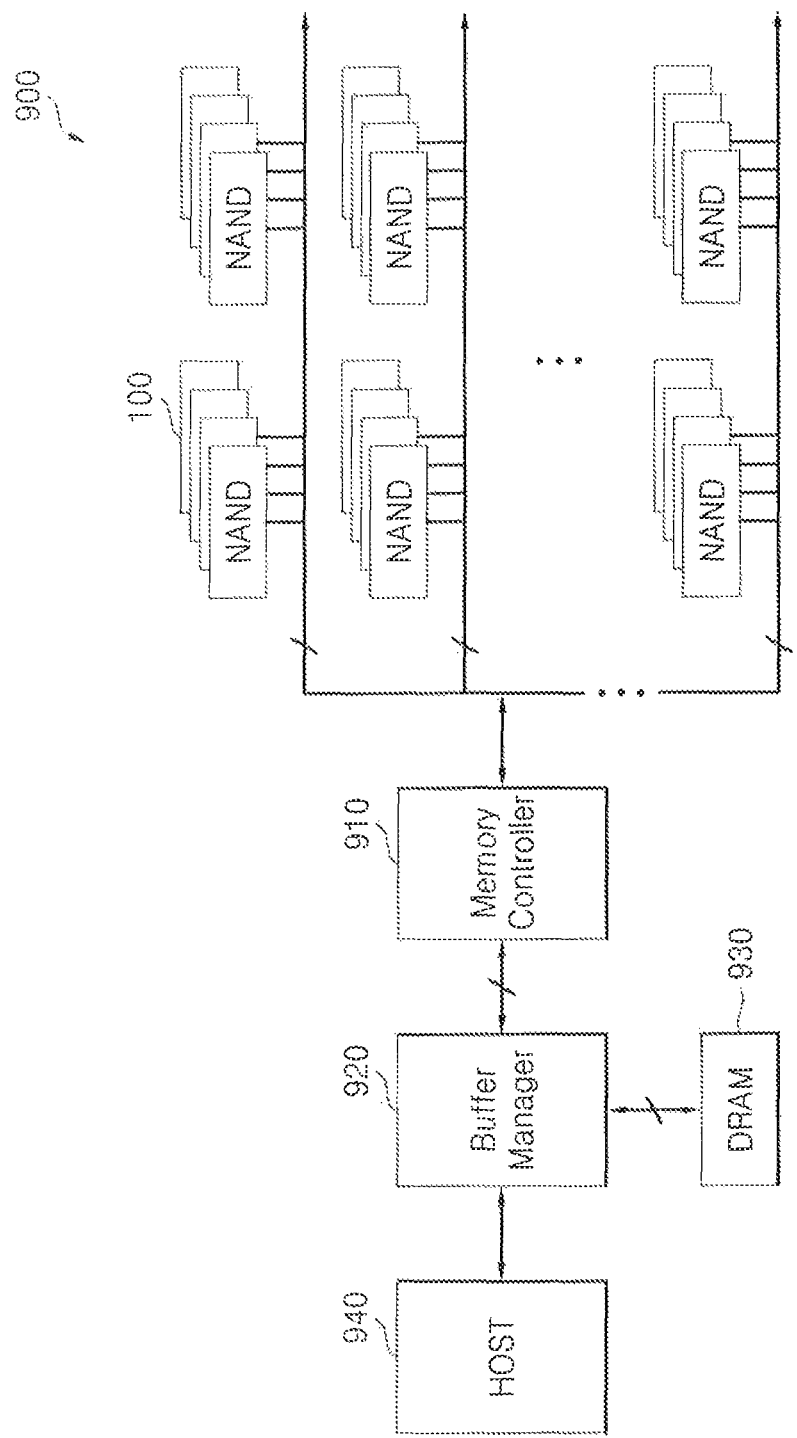
FIG. 17 is a block diagram of a memory system including a memory device illustrated in FIG. 7, according to an exemplary embodiment of the inventive concept.

FIG. 17 is a block diagram of a memory system 900 including a memory device illustrated in FIG. 7, according to an exemplary embodiment of the inventive concept. The memory system 900 may be implemented in a data storage system like a solid state drive (SSD).

The memory system 900 may include a plurality of memory devices 100, a memory controller 910 controlling the data processing operations of each of the plurality of memory devices 100, a volatile memory device 930 like a dynamic random access memory (DRAM), and a buffer manager 920 controlling data transferred between the memory controller 910 and a host 940 to be stored in the volatile memory device 930.

Each of the plurality of memory devices 100 may be the memory device illustrated in FIG. 7.

Figure 18:
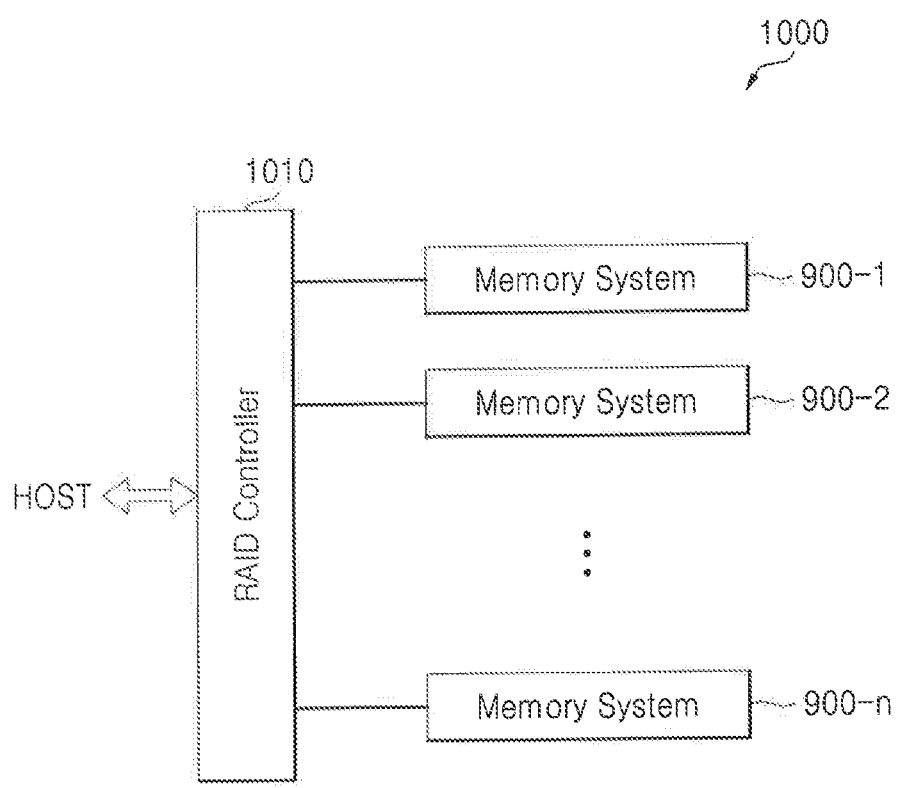
FIG. 18 is a block diagram of a data processing apparatus including a memory system illustrated in FIG. 17, according to an exemplary embodiment of the inventive concept.

FIG. 18 is a block diagram of a data processing apparatus 1000 including a memory system 900 illustrated in FIG. 17, according to an exemplary embodiment of the inventive concept. Referring to FIGS. 17 and 18, the data processing apparatus 1000 may be implemented as a redundant array of independent disks (RAID) system. The data processing apparatus 1000 includes a RAID controller 1010 and a plurality of memory systems 900-1 through 900-n where "n" is a natural number.

Each of the memory systems 900-1 through 900-n may be the memory system 900 illustrated in FIG. 17. The memory systems 900-1 through 900-n may form a RAID array. The data processing apparatus 1000 may be a PC or an SSD.

During a program operation, the RAID controller 1010 may transmit program data output from a host to at least one of the memory systems 900-1 through 900-n according to a RAID level in response to a program command received from the host. During a read operation, the RAID controller 1010 may transmit, to the host, data read from at least one of the memory systems 900-1 through 900-n in response to a read command received from the host.

A process variation compensation circuit and a method of operating the same according to exemplary embodiments of the inventive concept may compensate for duty characteristics of an input buffer by detecting a process variation in the input buffer, thus reducing the amount of additional current to be consumed during an optimization process of the input buffer.

When the same amount of current is consumed during the optimization process, the duty characteristics of the input buffer may be improved when an exemplary embodiment of the inventive concept is employed.

While the inventive concept has been shown and described with reference to exemplary embodiments thereof, it will be understood by one of ordinary skill in the art that various changes in form and detail may be made thereto without departing from the spirit and scope of the inventive concept as defined by the following claims.

What is claimed is:

1. A compensation circuit for use with an input buffer, the compensation circuit comprising:
   an input buffer configured to amplify an input signal and output a compensated signal;
   a process detector including a replica of the input buffer, the process detector configured to output at least one comparison signal indicating a variation in the input buffer,
   wherein the input buffer is configured to control an output signal based on the at least one comparison signal,
   wherein the input buffer comprises an input buffer differential amplifier configured to receive and differentially amplify a reference voltage and the input signal, and the replica comprises a replica buffer differential amplifier including two input terminals to which the reference voltage is applied, the replica buffer differential amplifier configured to output a replica voltage, and
   wherein the input buffer further comprises an output adjust unit configured to decrease a bias voltage of an output terminal when the variation is slow-fast (SF) and to increase the bias voltage of the output terminal when the variation is fast-slow (FS).

2. The compensation circuit of claim 1, wherein the input buffer is configured to control a bias voltage of an output terminal according to the at least one comparison signal.

3. The compensation circuit of claim 1, further comprising:
   a first comparator configured to compare the replica voltage with a first reference voltage and output a first comparison signal according to a result of the comparison; and
   a second comparator configured to compare the replica voltage with a second reference voltage and output a second comparison signal according to a result of the comparison.

4. The compensation circuit of claim 3, further comprising:
   a first storage unit configured to store the first comparison signal; and
   a second storage unit configured to store the second comparison signal.

5. The compensation circuit of claim 3, wherein the input buffer differential amplifier comprises:
   a pull-down unit connected with a first pull-down node having a bias voltage that is less than or equal to the bias voltage of the output terminal and a second pull-down node having a bias voltage that is less than the bias voltage of the first pull-down node, the pull-down unit selectively switched according to the first comparison signal; and
   a pull-up unit connected with a first pull-up node having a bias voltage that is equal to or greater than the bias voltage of the output terminal and a second pull-up node having a bias voltage that is greater than the bias voltage of the first pull-up node, the pull-up unit selectively switched according to the second comparison signal.

6. The compensation circuit of claim 3, wherein the first reference voltage and the second reference voltage are set based on a preset condition of process corners of the input buffer.

7. The compensation circuit of claim 1, wherein each of the input buffer differential amplifier and the replica buffer differential amplifier includes a Bazes type buffer, an N-P type buffer, or a combination of the Bazes type buffer and the N-P type buffer.

8. A semiconductor device comprising the compensation circuit of the input buffer of claim 1.

9. The semiconductor device of claim 8, which is a dynamic random access memory (DRAM) configured to receive an address signal, a command signal, and a data input signal, wherein the input buffer amplifies the address signal, the command signal, or the data input signal.

10. A method of compensating for a variation in an input buffer of a semiconductor device, the method comprising:
    detecting a variation in the input buffer by using a replica of the input buffer; and
    controlling an output of the input buffer based on the detected variation,
    wherein the input buffer comprises an input buffer differential amplifier configured to receive and differentially amplify a reference voltage and an input signal, and the replica comprises a replica buffer differential amplifier configured to output a replica voltage,
    comparing the replica voltage with a first reference voltage and output a first comparison signal according to a result of the comparison;

comparing the replica voltage with a second reference voltage and output a second comparison signal according to a result of the comparison;

storing the first comparison signal; and storing the second comparison signal.

11. The method of claim 10, wherein detecting the variation comprises comparing an output of the replica with preset reference voltages and outputting logic levels according to a result of the comparison.

12. The method of claim 10, wherein detecting the variation further comprises storing the logic levels in registers, respectively, and wherein the output of the input buffer is controlled based on the logic levels stored in the registers.

13. The method of claim 10, wherein the semiconductor device is a dynamic random access memory (DRAM), and wherein detecting the variation is performed together with ZQ calibration of the DRAM.

14. A variation compensation circuit comprising:

a first buffer configured to receive an input signal and a reference signal through two input terminals, respectively, and output an output signal;

a second buffer having substantially the same configuration as the first buffer, the second buffer configured to receive the reference signal through two input terminals and output a replica voltage;

a first comparator configured to compare the replica voltage with a first reference voltage and output a first comparison signal;

a second comparator configured to compare the replica voltage with a second reference voltage and output a second comparison signal, wherein the first buffer is configured to adjust the output signal depending on the first comparison signal and the second comparison signal;

a first storage unit configured to store the first comparison signal; and a second storage unit configured to store the second comparison signal.

15. The circuit of claim 14, wherein the first buffer comprises a differential amplifier.

16. The circuit of claim 14, wherein the first reference voltage and the second reference voltage are set based on a preset condition of process corners of the first buffer.

17. The circuit of claim 15, wherein the differential amplifier includes a Bazes type buffer or an N-P type buffer.

* * * * *